United States Patent [19]

Huang

[11] Patent Number: 5,413,969
[45] Date of Patent: May 9, 1995

[54] DIFFERENTIAL TREATMENT TO SELECTIVELY AVOID SILICIDE FORMATION ON ESD I/O TRANSISTORS IN A SALICIDE PROCESS

[75] Inventor: Tiao-Yuan Huang, Cupertino, Calif.

[73] Assignee: VLSI Technology, Inc., San Jose, Calif.

[21] Appl. No.: 156,159

[22] Filed: Nov. 23, 1999

[51] Int. Cl.$^6$ .................. H01L 21/44; H01L 21/48
[52] U.S. Cl. ........................... 437/200; 437/56; 437/58; 437/24; 437/44; 257/360
[58] Field of Search ............... 437/200, 192, 247, 41, 437/56, 58, 57

[56] References Cited

U.S. PATENT DOCUMENTS

| | | | |
|---|---|---|---|
| 4,835,112 | 5/1989 | Pfiester et al. | 437/41 |
| 5,043,300 | 8/1991 | Nulman | 437/200 |
| 5,262,344 | 11/1993 | Mistry | 437/57 |
| 5,342,798 | 8/1994 | Huang | 437/41 |

OTHER PUBLICATIONS

L. M. Rubin, et al. "Silicided Shallow Junction Formation Using Ion Implantation and Thermal Annealing" Proc. and Char. of Materials Using Ion Beams, Materials Res. Sec. 1989 (month unknown) pp. 641-645.

Y. Wei, Y. Loh, C. Wang and C. Hu, *MOSFET Drain Engineering for ESD Performance*, EOS/ESD Symposium, 1992, pp. 143-148.

Silicon Processing for the VLSI Era—vol. 2, Process Integration, pp. 144-152, 154, 155 (date unknown).

C. Duvvury, R. N. Rountree, Y. Fong, and R. A. McPhee, *ESD Phenomena and Protection Issues in CMOS Output Buffers*, IEEE/IRPS, 1987, pp. 174-180.

D. Krakauer, K. Mistry, *ESD Protection in a 3.3 Volt Sub-Micron Silicided CMOS Technology*, EOS/ESD Symposium, 1992, pp. 250-257.

T. Yamaguchi, et al., *High-Speed Latchup-Free 0.5 μm-Channel CMOS Using Self-Aligned TiSi$_2$ and Deep-Trench Isolation Technologies*, IEDM 83, 24.3, 1983 pp. 522-525.

Primary Examiner—Olik Chaudhuri
Assistant Examiner—C. Everhart
Attorney, Agent, or Firm—Douglas L. Weller

[57] ABSTRACT

Selective salicidation of source/drain regions of a transistor is accomplished by differentially treating a first subset of the source/drain regions to hinder formation of metal-silicide over the first subset of the source/drain regions. A metal layer is formed over the first subset of the source/drain regions and a second subset of the source/drain regions. The metal layer is annealed at a temperature such that the metal reacts to form metal-silicide over the second subset of the source/drain regions, but not over the first subset of the source/drain regions. The unreacted metal is stripped off over the first subset of the source/drain regions. In the preferred embodiment of the present invention, a second anneal is then performed to fully form metal-silicide over the second subset of the source/drain regions.

21 Claims, 6 Drawing Sheets

DIFFERENTIAL TREATMENT TO SELECTIVELY AVOID SILICIDE FORMATION ON ESD I/O TRANSISTORS IN A SALICIDE PROCESS

BACKGROUND

This invention relates to selective salicidation of source/drain regions of a transistor, for example, for use in the production of electro-static discharge (ESD) transistors connected to circuit input/output pads and used to protect semiconductor devices from damage resulting from electrostatic discharge.

As the size of circuitry within integrated circuits continues to decrease, it is often desirable to include a metal-silicide region as part of the source/drain region. This minimizes the series source/drain resistance and avoids transistor performance degradation. See for example, *Silicon Processing for the VLSI Era—Volume 2, Process Integration* pp. 144–152.

However, using metal-silicide regions in source-drain regions of electrostatic discharge (ESD) transistors can be detrimental to circuit performance. ESD can be a source of destruction for semiconductor devices. Various input protection circuits may be used to protect the input circuits from electrostatic discharge damage. However, these same protection circuits are generally not used for output buffers and input/output (I/O) pads due to performance constraints. See for Example, Y. Wei, Y. Loh, C. Wang and C. Hu, *MOSFET Drain Engineering for ESD Performance*, EOS/ESD Symposium, 1992, pp. 143–148. For output buffers and I/O buffers, n-channel pull-down transistors must be properly desired to ensure adequate ESD performance. These n-channel pull-down transistors used for I/O buffers, n-channel pull-down transistors are sometimes referred to as ESD transistors However, using metal-silicide regions in source-drain regions of transistors can seriously degrade ESD hardness, increasing the possibility of ESD damage to logic circuitry within semiconductor devices. See for example, C. Duvvury, R. N. Rountree, Y. Fong, and R. A. McPhee, *ESD Phenomena and Protection Issues in CMOS Output Buffers*, IEEE/IRPS, 1987, pp. 174–180. Because of this it is desirable to prevent metal-silicide regions from being included as part of the drain region of an ESD transistor. See, for example, D. Krakauer, K. Mistry, *ESD Protection in a 3.3 Volt Sub-Micron Silicided CMOS Technology*, EOS/ESD Symposium, 1992, pp. 250–257. It is desirable therefore, to formulate an efficient and effective method which allows selective salicidation of source/drain regions.

SUMMARY OF THE INVENTION

In accordance with the preferred embodiment of the present invention, a method for selective salicidation of source/drain regions of a transistor is presented. A first subset of the source/drain regions are differentially treated to hinder formation of metal-silicide over the first subset of the source/drain regions. For example, arsenic atoms are implanted into the first subset of the source/drain region at a concentration of at least $2 \times 10^{15}$ per square centimeter. Alternately, the first subset of the source/drain region is treated using preamorphization, for example, by implanting $Si^+$, $Sn^+$ and $Ge^+$ ions. In addition or alternatively, the first subset of the source/drain regions may be cleaned with wet chemicals or plasma or backsputtered with Argon, Nitrogen or Oxygen.

A metal layer is formed over the first subset of the source/drain regions and a second subset of the source/drain regions. The metal layer is annealed at a temperature such that the metal reacts to form metal-silicide over the second subset of the source/drain regions, but not over the first subset of the source/drain regions. The unreacted metal is stripped off over the first subset of the source/drain regions. In the preferred embodiment of the present invention, a second anneal is then performed to fully form metal-silicide over the second subset of the source/drain regions.

The present invention allows for selective salicidation of source/drain regions of a transistor. The process is self-aligned and compatible with current semiconductor processes.

DESCRIPTION OF THE PREFERRED EMBODIMENT

Figure 1:
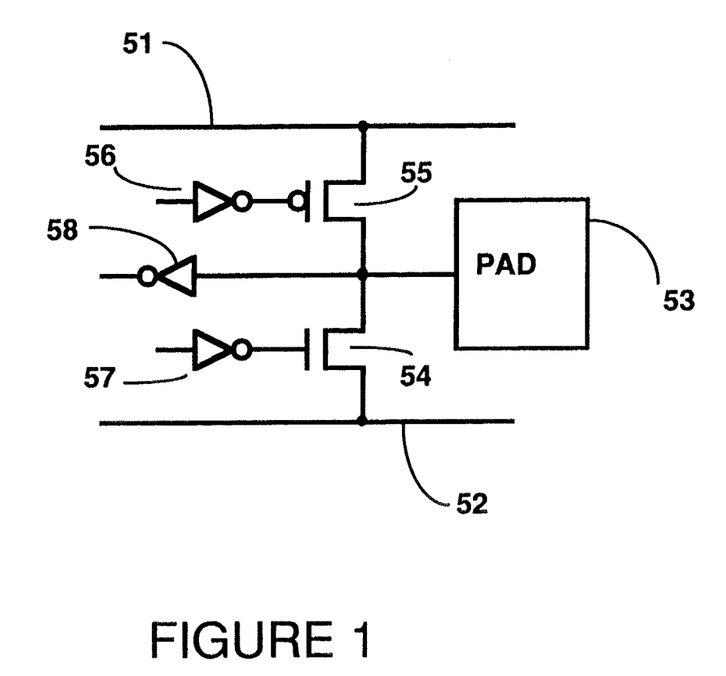
FIG. 1 shows an I/O buffer circuit for an integrated circuit.

FIG. 1 shows an example of a buffer circuit for a pad 53. Many other types of buffer circuits exist to which the teachings of the present invention could be applied. The buffer circuit selects to be electrically connected to pad 53 either a $V_{DD}$ voltage on a $V_{DD}$ line 51, or a $V_{SS}$ voltage on a $V_{SS}$ line 52. The buffer circuit includes a p-channel buffer transistor 55 and an n-channel buffer transistor 54. P-channel buffer transistor 55 is controlled by an inverter 56. N-channel buffer transistor 54 is controlled by an inverter 57. Input from pad 53 is received by an inverter 58. In the preferred embodiment of the present invention, n-channel buffer transistor 54 is an asymmetric electro-static discharge buffer transistor.

For the preferred embodiment, the requirements for source/drain junctions for an output buffer transistor are quite different than requirements for source/drain junctions for other transistors. For the drain junction, some kind of drain engineering to achieve a gradient drain junction is normally required. For example a lightly doped drain (LDD) or a double diffused drain (DDD) can be used. This will meet the required hot-carrier lifetime while simultaneously maintaining a sufficient electro-static discharge (ESD) threshold, and a large enough snap-back voltage to allow high-voltage burn-in (B/I). Furthermore in the preferred embodiment, placing a metal-silicide region over the drain junction of an output buffer transistor is undesirable, as such a metal-silicide drain severely degrades the ESD performance by reducing ESD hardness.

In an alternate preferred embodiment of the present invention, a metal-silicide region is placed over the source junction of an output buffer transistor and not over the drain junction of the output buffer transistor.

In the alternate preferred embodiment of the present invention, for the source/drain junction of other transistors on the circuit, the most important criteria is to achieve minimum source series resistance. Therefore, a heavily-doped source/drain junctions (i.e., instead of LDD), and metal-silicide source/source junctions are desirable for optimal transistor performance. A heavily-doped source/drain junction reduces the undesirable source/drain series resistance. Source series resistance is more detrimental than drain series resistance in degrading the transistor performance. This is because source series resistance not only adds a series resistance to the source-drain current path, it also degrades the effective gate bias.

A minimum resistance between the different source junctions of NMOS ladder-type pull-down transistors (or multiple looped pull-down transistors) used in CMOS VLSI circuitry is also important in order to ensure that all poly fingers are properly turned on during ESD events, thus promoting good ESD performance.

In the alternate preferred embodiment of the present invention, asymmetric source-drain junctions are used for ESD buffer transistors. Key features of ESD transistors constructed in accordance with the preferred embodiment are the incorporation of a drain junction without silicidation with the use of a source region consisting of a conventional n+ junction with silicidation. Local interconnect (such as TiN formed during TiSi$_2$ salicidation) is also proposed to reduce the series resistance between the source junctions of different transistors in the ladder-type or multiple looped pull-down transistors whenever a short metal routing is not available.

Figure 2:
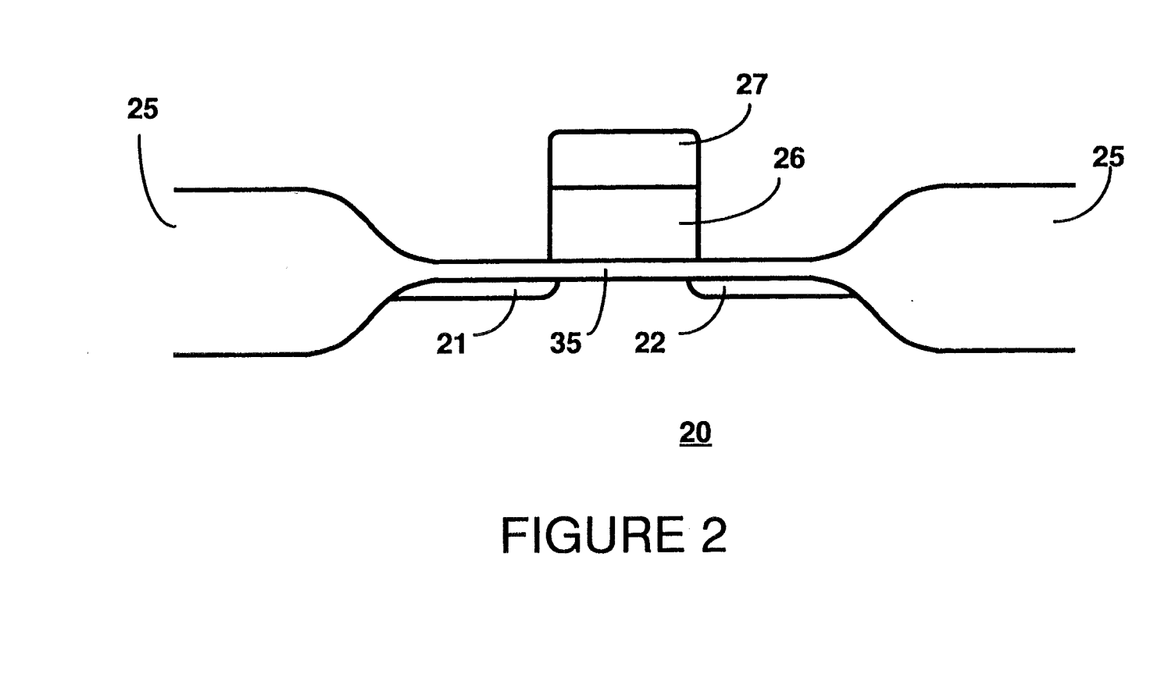
FIGS. 2 and 3 illustrate processing steps for producing an asymmetric electro-static discharge transistor in accordance with preferred embodiment of the present inventions.
Figure 3:
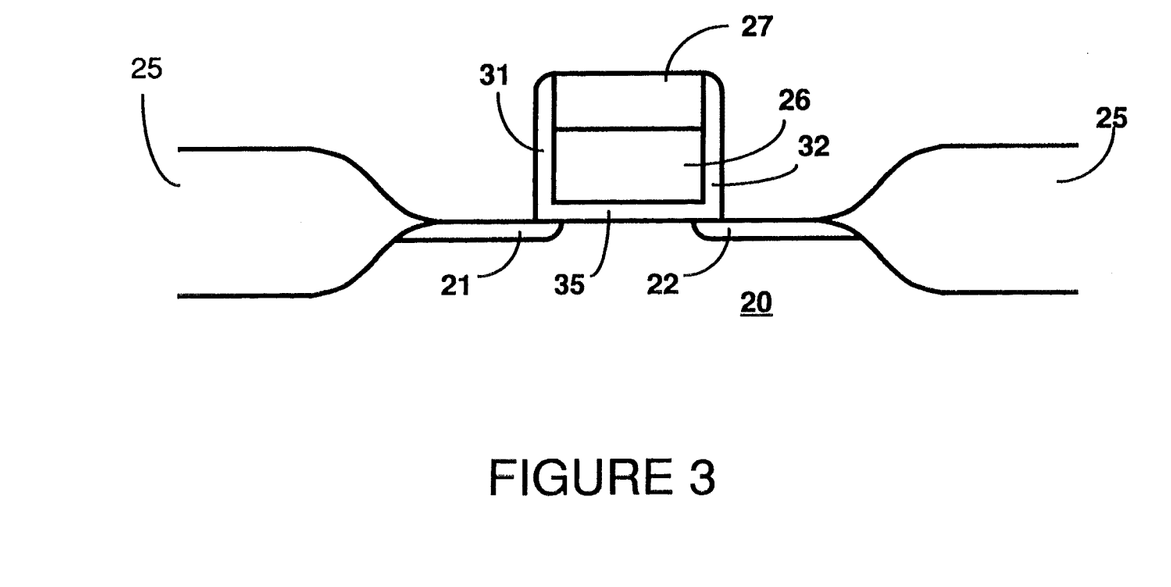

FIG. 2 through FIG. 3 illustrate processing steps used for producing an electro-static discharge transistor in accordance with the preferred embodiments of the present invention.

The structure shown in FIG. 2 is formed in a well 20 of first conductivity type within a substrate. For example, the substrate may be of p-type material doped with $10^{15}$ atoms per cubic centimeter. Alternately, the substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. First gate region 26 may be made of polysilicon, for example, doped with n-type atoms at $10^{20}$ atoms per cubic centimeter.

Gate region 26 may be formed, for example, by chemical vapor deposition (CVD) of a polysilicon layer. The polysilicon is doped using POCl$_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of a metal-silicide region 27 on top of first gate region 26. The etch exposes the gate oxide layer on top of the substrate.

On the sides of gate region 26 and region 27 are implanted a region 21 and a region 22 of second conductivity type. Region 21 and region 22 act as source/drain regions for a transistor. For example, region 21 and region 22 are n− regions doped with Phosphorus at $10^{17}$ atoms per cubic centimeter. For example, region 21 and region 22 extend 0.15 micrometers below the surface of the substrate. Alternately, region 21 and region 22 may be p− regions. The resultant structure is shown in FIG. 2.

The exposed portions of the gate oxide layer 35 are dipped off using, for example, a fifty to one mixture of H$_2$O and HF. A deposition and etch back are used to form a sidewall region 31 and a sidewall region 32, which are on opposite sides of polysilicon region 26. Sidewall region 31 and sidewall region 32 serve as a spacers around polysilicon region 26. Sidewall region 31 and sidewall region 32 may be formed, for example by oxide deposition and etch back. Alternately, sidewall region 31 and sidewall region 32 may be formed by nitride deposition and etch back. For example, sidewall region 31 and sidewall region 32 are CVD oxide and each extends approximately 0.3 microns outward from polysilicon region 26. A dilute Hydrogen-Fluorine (HF) dip may be used to clear residual oxide over source/drain region 21 and source/drain region 22. The resulting structure is shown in FIG. 3.

Figure 4:
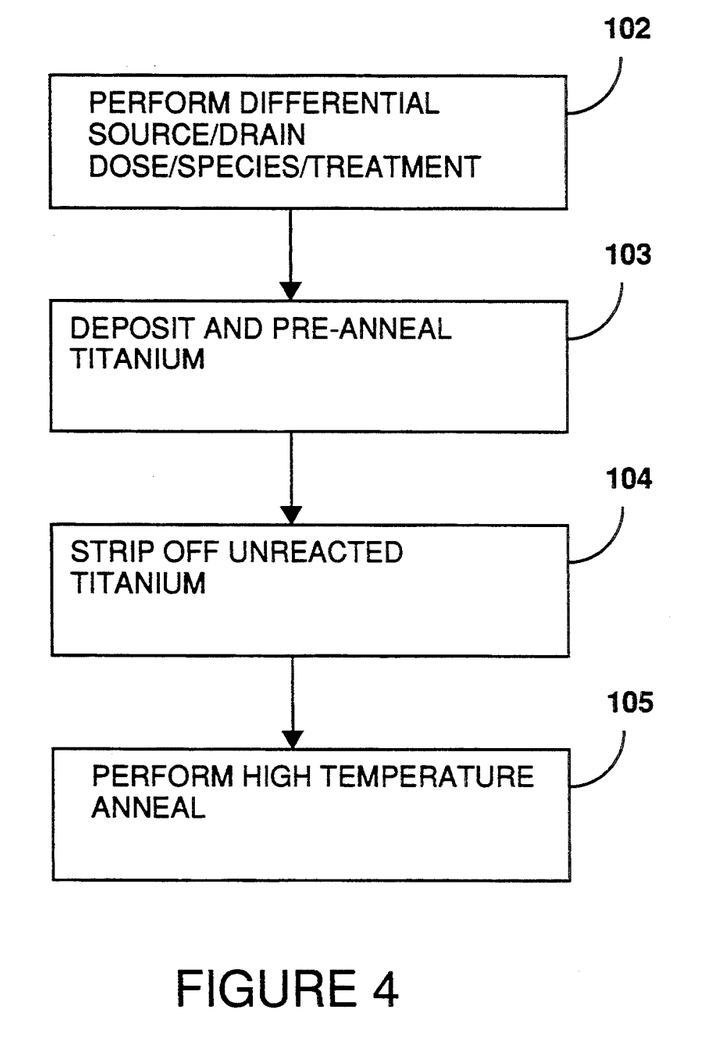
FIG. 4 shows a flowchart for process for selective salicidation of source/drain regions of a transistor in accordance with preferred embodiments of the present invention.

FIG. 4 shows simplified method steps for the preferred embodiments of the present invention. In a step 102, a differential source/drain treatment is performed. The differential treatment of source/drain junctions allows silicide to be formed over some source/drain junctions and not others. Various embodiments of the source/drain differential treatment may be utilized. For example, at the location of source/drain junctions over which it is not desired to form silicide (e.g., region 22 and/or region 21), an implant of arsenic may be performed. The implant of arsenic should be done at a concentration of greater than $2 \times 10^{15}$ per square centimeter to hinder formation of silicide. At the location of source/drain junctions over which it is desired to form silicide, an implant of arsenic may also (optionally) be performed, however, implant of arsenic should be done at a concentration of less than $2 \times 10^{15}$ per square centimeter so that the formation of silicide is not hindered.

Alternately, the locations of source/drain junctions over which it is not desired to form silicide (e.g., region 22 and/or region 21) may be treated using preamorphization, for example by implanting Si+, Sn+ or Ge+. Also, the locations of source/drain junctions over which it is not desired to form silicide (e.g., region 22 and/or region 21) may be backsputtered with Argon, Nitrogen or Oxygen or cleaned by wet chemicals or plasma to hinder the formation of silicide. While the above discusses examples of differential treatment which may be utilized in various embodiments, in essence, many other differential treatments may be performed in conformance with the preferred embodiment of the present invention. What is essential is that the transistor source/drain regions over which it is not desired to form silicide are treated in such a way that silicide formation is hindered.

After the differential source/drain treatment is performed in step 102, a thin layer of metal is deposited over the substrate. In the preferred embodiment, the metal is Titanium (Ti). Alternately, the metal layer may consist of another metal such as, for example, Molybdenum (Mo), Chromium (Cr), Nickel (Ni), Platinum (Pt), Cobalt (Co), or Tantalum (Ta). While in the following discussion of the present invention, reference is made to Titanium layers, for any reference to Titanium, these other metals may be substituted for Titanium. The layer of metal is, for example, 0.05 microns thick. After deposition of the metal layer, an anneal is used to form Titanium-silicide (TiSix) over all source/drain regions except the drain region of the n-channel ESD transistors. This anneal may be performed either in a furnace or as a rapid thermal anneal.

For example, a rapid thermal anneal may be done by heating the substrate to approximately 700 degrees Celsius for a period of approximately 15 seconds. Alternately, in a furnace, the substrate may be heated to approximately 625 degrees Celsius for a period of approximately 10 minutes or longer in a nitrogen ($N_2$) ambient.

As a result of the anneal, Titanium-silicide (TiSix) is formed over all source/drain regions except the treated source/drain regions of the n-channel ESD transistors. That is, where the source/drain of transistors have been treated as described above, no silicidation occurs.

In a step 104, the unreacted Titanium on top of the source-drain of the ESD transistors and elsewhere is stripped off, for example using a rinse of a mixture of $NH_4OH$, $H_2O_2$ and $H_2O$. Afterwards, in a step 105, a high-temp anneal (e.g., 800° C.) is applied to fully form the highly conductive metal-silicide on the source-drain of the regular transistors.

For ESD pull-down n-channel transistors, the result is that a metal-silicide region 49 is formed over the source junction; however, no metal-silicide region is formed over the drain junction.

After forming metal-silicide region 51, disposable sidewall spacer 31 on the source side of the n-channel ESD transistor is removed. This is done, for example, using a wet etch. In addition to the disposable sidewall spacers on the source side of all the n-channel ESD transistors, sidewall spacers may (optionally) be removed from all the transistors on the source side only.

Figure 5:
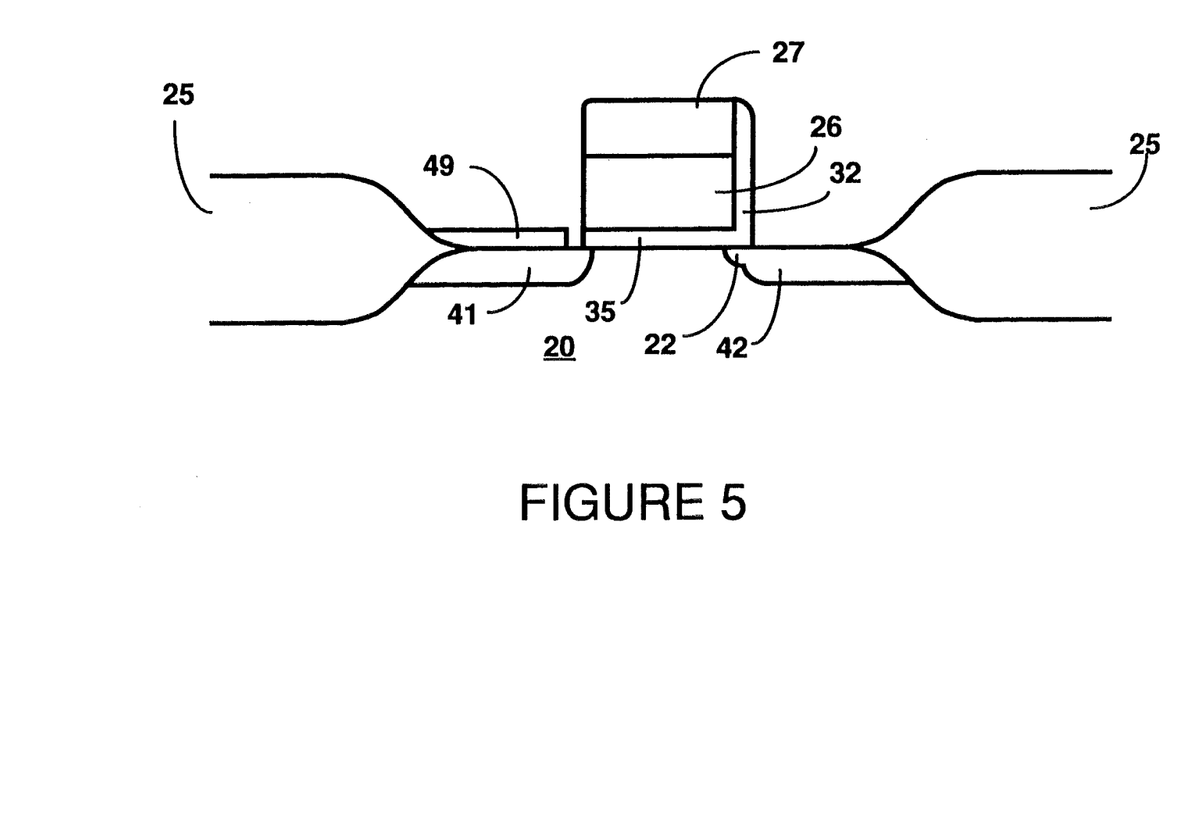
FIG. 5 and FIG. 6 show electro-static discharge transistors formed in accordance with preferred embodiments of the present invention.
Figure 6:
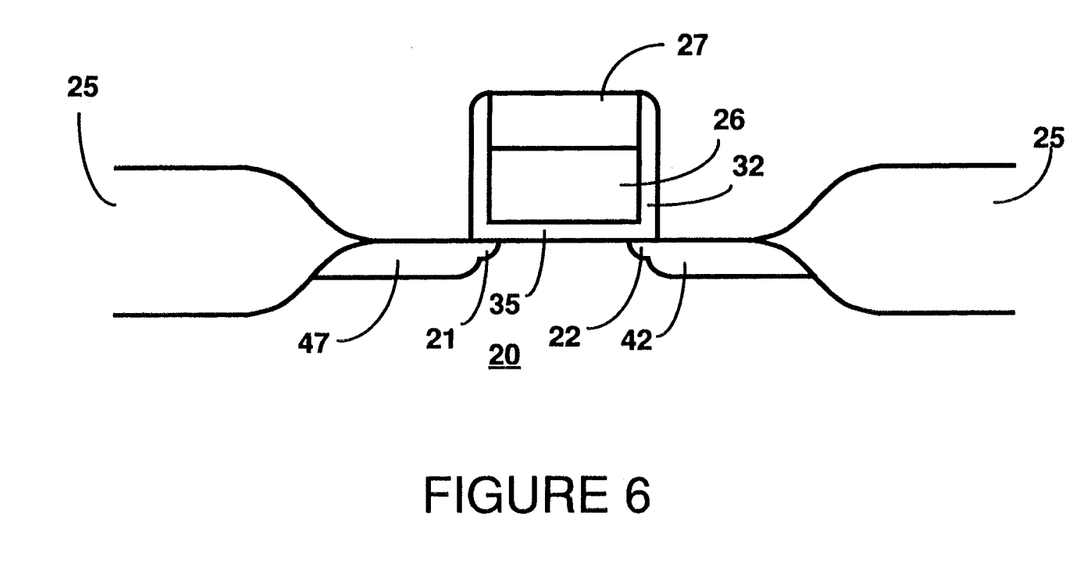

The regular n+ and p+ source-drain implant can then be performed on the circuit. For example, an ion implant is used to dope n+ source region 41 and n+ drain region 42 with n+-type atoms at $10^{20}$ atoms per cubic centimeter. As shown in FIG. 5, region 22 and not region 21 received differential source/drain treatment. Further, sidewall spacer 31 has been removed and n+ source region 41 thus completely overtakes n⁻ region 21. Because sidewall spacer 32 remains, n+ drain region 42 only partially overtakes n⁻ region 22. The n+ implant penetrates the metal-silicide region on the source. As shown in FIG. 6, both region 22 and region 21 received differential source/drain treatment is performed. Further, sidewall spacer 31 has been not removed and n+ source region 47 only partially overtakes n⁻ region 21.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for selective salicidation of source/drain regions of transistors on an integrated circuit, the method comprising the steps of:
   (a) differentially treating a first subset of the source/drain regions to hinder formation of metal-silicide over the first subset of the source/drain regions by performing an implant of atoms into the first subset of the source/drain regions, but not into a second set of the source/drain regions;
   (b) depositing a metal layer over the first subset of the source/drain regions and the second subset of the source/drain regions;
   (c) annealing the metal layer deposited in step (b), the annealing being done at a temperature such that the metal reacts to form metal-silicide over the second subset of the source/drain regions, but not over the first subset of the source/drain regions; and,
   (d) stripping off the unreacted metal from over the first plurality of the source/drain regions.

2. A method as in claim 1 wherein the implant performed in step (a) is an implant of atoms into source/drain regions of transistors used to provide protection for the integrated circuit against electrostatic discharge.

3. A method as in claim 1 wherein before step (a), a low doping density implant is performed in the first subset of the source/drain regions and the second subset of the source/drain regions.

4. A method as in claim 1 wherein the implant performed in step (a) is an n+ source/drain implant.

5. A method as in claim 1 wherein the implant performed in step (a) is a p+ source/drain implant.

6. A method as in claim 1 wherein in step (b), the integrated circuit is in a wet ambient and is heated to approximately 800 degrees Centigrade.

7. A method as in claim 1 wherein the metal layer deposited in step (b) is Titanium.

8. A method as in claim 1 wherein the annealing performed in step (c) is a rapid thermal anneal at approximately 700 degrees centigrade for approximately 15 seconds.

9. A method as in claim 1 wherein the annealing performed in step (c) is a rapid thermal anneal at approximately 625 degrees centigrade for at least 10 minutes.

10. A method as in claim 1, additionally comprising the step of:
    (e) after step (d), performing a second anneal to fully form metal-silicide over the second subset of the source/drain regions.

11. A method as in claim 1 additionally comprising the step of:
    before step (a), forming polycide gates regions for the integrated circuit.

12. A method as in claim 1 additionally comprising the steps of:

before step (a), forming polysilicon gate regions for the integrated circuit, and forming dielectric regions over the polysilicon gate regions.

13. A method as in claim 12 additionally comprising the step of:

before step (b) removing the dielectric regions from the polysilicon gate regions.

14. A method as in claim 1 wherein before step (a) the following steps are performed:

forming gate regions for the integrated circuit; and, forming sidewall spacers around the gate regions.

15. A method as in claim 14 additionally comprising the step of:

after forming the gate regions and before forming the sidewall spacers, performing low doping density implants in the first subset of the source/drain regions and the second subset of the source/drain regions.

16. A method as in claim 14 wherein the first subset of the source/drain regions are source/drain regions of transistors used to provide protection for the integrated circuit against electrostatic discharge.

17. A method as in claim 1 wherein step (a) includes implanting arsenic atoms into the first subset of the source/drain region at a concentration of at least $2 \times 10^{15}$ per square centimeter.

18. A method as in claim 1 wherein step (a) includes treating the first subset of the source/drain region using preamorphization.

19. A method as in claim 1 wherein the preamorphization includes, implanting one of $Si^+$, $Sn^+$ and $Ge^+$.

20. A method as in claim 1 wherein step (a) includes backsputtering the first subset of the source/drain regions with one or more of Argon, Nitrogen and Oxygen.

21. A method as in claim 1 wherein step (a) includes cleaning the first subset of the source/drain regions.

* * * * *